(12) United States Patent
Arndt et al.

(10) Patent No.: US 7,948,152 B2
(45) Date of Patent: May 24, 2011

(54) CLADDING COMPRISING AN INTEGRATED POLYMER ACTUATOR FOR THE DEFORMATION OF SAID CLADDING

(75) Inventors: Frank Arndt, Berlin (DE); Ursus Kruger, Berlin (DE); Volkmar Luthen, Berlin (DE); Arno Steckenborn, Berlin (DE); Matthias Stossel, Mannheim (DE); Raymond Ullrich, Schonwalde (DE)

(73) Assignee: Siemens Aktiengesellschaft, Munich (DE)

( * ) Notice: Subject to any disclaimer, the term of this patent is extended or adjusted under 35 U.S.C. 154(b) by 372 days.

(21) Appl. No.: 10/590,962

(22) PCT Filed: Mar. 2, 2005

(86) PCT No.: PCT/DE2005/000381
§ 371 (c)(1),
(2), (4) Date: Aug. 29, 2006

(87) PCT Pub. No.: WO2005/085655
PCT Pub. Date: Sep. 15, 2005

(65) Prior Publication Data
US 2007/0189702 A1 Aug. 16, 2007

(30) Foreign Application Priority Data
Mar. 4, 2004 (DE) .......................... 10 2004 011 030

(51) Int. Cl.
*H01L 41/04* (2006.01)
(52) U.S. Cl. ....................................... 310/332; 310/800
(58) Field of Classification Search .......... 310/330–332, 310/365–367, 371, 800
See application file for complete search history.

(56) References Cited

U.S. PATENT DOCUMENTS

| 4,539,575 A | * | 9/1985 | Nilsson | 347/68 |
| 4,690,353 A | | 9/1987 | Haslim et al. | |
| 4,982,121 A | * | 1/1991 | Lardiere et al. | 310/10 |
| 5,596,239 A | * | 1/1997 | Dydyk | 310/311 |
| 5,774,252 A | | 6/1998 | Lin et al. | |
| 6,222,304 B1 | * | 4/2001 | Bernstein | 310/328 |

(Continued)

FOREIGN PATENT DOCUMENTS
DE  22 59 749  6/1974
(Continued)

OTHER PUBLICATIONS

Ron Pelrine et al., "Application of Dielectric Elastomer Actuators". In; Smart Structures and Materials 2001, Proceedings of SPIE vol. 4329 (2001) pp. 335-349.

*Primary Examiner* — Derek J Rosenau
(74) *Attorney, Agent, or Firm* — Young & Thompson

(57) ABSTRACT

A cladding (22) for a wall (12) includes a barrier layer (24) that can be deformed by the action of a polymer actuator (14). According to the invention, a contact surface (A) of the cladding lies completely against the wall, at least in the non-deformed state, stabilizing the intrinsically elastic wall cladding. For example, the wall cladding can be fixed to the wall (12) in the form of lamellae (22), at respective points, in such a way that the activation of the polymer actuator (14) causes the lamellae (22) to bend, thus permitting, for example, a layer (25) of ice to be detached from the cladding. Alternatively, the cladding can also be configured from a membrane actuator, which is fixed at points, or by its entire surface to the wall (12).

7 Claims, 1 Drawing Sheet

U.S. PATENT DOCUMENTS

| | | |
|---|---|---|
| 6,358,021 B1 | 3/2002 | Cabuz |
| 6,376,971 B1 | 4/2002 | Pelrine et al. |
| 6,803,700 B2 * | 10/2004 | Maushard et al. ............ 310/330 |
| 2002/0043901 A1 * | 4/2002 | Kihara et al. ................. 310/366 |
| 2002/0122561 A1 * | 9/2002 | Pelrine et al. ................. 381/191 |
| 2004/0263028 A1 * | 12/2004 | Pei et al. ....................... 310/800 |
| 2006/0192465 A1 * | 8/2006 | Kornbluh et al. ............. 310/800 |
| 2006/0239635 A1 * | 10/2006 | Zalalutdinov et al. ........ 385/147 |

FOREIGN PATENT DOCUMENTS

| | | |
|---|---|---|
| DE | 44 46 031 | 6/1996 |
| EP | 0 422 746 | 4/1991 |
| GB | 2 296 306 | 11/1995 |
| GB | 2 296 696 | 12/1995 |

\* cited by examiner

CLADDING COMPRISING AN INTEGRATED POLYMER ACTUATOR FOR THE DEFORMATION OF SAID CLADDING

This is a 371 National Stage application of International application no. PCT/DE05/00381, filed Mar. 2, 2005.

BACKGROUND OF THE INVENTION

The invention relates to a cladding with an elastic boundary layer which forms the surface of the cladding, and a polymer actuator which is integrated in the cladding for the deformation of the boundary layer.

A cladding of the type mentioned in the introduction is described, for example, by Ron Pelrin on pages of 335 to 349 of "Smart Structures and Materials 2001", Proceedings of SPIE vol. 4329 (2001). According to this publication, a cladding may comprise a membrane-like polymer actuator which is applied to an array of circular holes. The membrane can be deformed above the circular holes by applying an electric field to the electrically active polymer, with the polymer actuator being supported on the webs between the circular holes. As a result, the surface structure of the cladding can be deformed, for example for aerodynamic purposes in order to minimize flow resistance.

Elastomers, for example silicone, can be used as the polymer layer for the polymer actuator. This means that an electrostatic elastomer actuator can be produced in which the polymer layer is deformed due to the mutual attraction of the electrode layers when an electric field is applied. However, the polymer layer can also comprise an electrically active polymer, for example PMMA (polymethyl methacrylate). In the case of electrically active polymers, the deformation due to the attraction of the electrode layers is additionally assisted by active deformation of the electrically active polymer in the electric field. Other materials for the polymer layer can be obtained by mixing said materials with one another or with other materials.

BRIEF SUMMARY OF THE INVENTION

The object of the invention is to provide a cladding with a deformable boundary layer, which cladding is firstly simple to produce and secondly has a high degree of stability.

According to the invention, this object is achieved in that the cladding bears against the cladded substrate by means of a bearing area which matches the surface area of the cladding in terms of magnitude, with only subregions of the bearing area being fixed to the substrate. The cladding is supported by the substrate in an optimum manner on account of the bearing area of the cladding bearing fully on the substrate to be cladded. Said cladding is therefore highly resistant to deformation caused by dynamic pressure, at least in the undeformed state in which it bears against the substrate, even, for example, with respect to a dynamic pressure in aerodynamic applications. The substrate used can therefore also be a continuous surface, that is to say that no recesses, such as the mentioned circular holes, are necessary. This advantageously simplifies production of the cladded surface, and the substrate is provided with a higher degree of stability at the same time.

The cladding could, for example, be applied to the wings of an airplane. In the normal operating state, the cladding bears firmly on the wing and, as already mentioned, has a high degree of dimensional stability. The polymer actuator is only operated if a layer of ice which has formed has to be cleared from the wing in order to prevent the aerodynamic properties of the wings being impaired. In order to deform the boundary layer of the cladding, the polymer actuator is activated by applying an electric field, so that said cladding is deformed. Since only subregions of the cladding are fixed to the substrate, the deformation between the subregions causes the cladding to arch away from the substrate if the polymer actuator is in the form of membrane actuator, so that a cavity is produced between the substrate and the cladding in these regions. In the deformed state, the cladding possesses an increased degree of inherent stability on account of the arching which is produced, so that the lack of support by the substrate is compensated for. After the ice is removed, the cladding again lies firmly on the substrate.

According to a further refinement of the invention, provision is made for the polymer actuator to be in the form of a membrane actuator. Membrane actuators can advantageously be produced for large areas in a cost-effective manner. The cladding may, for example, be produced in the form of a film-of foil-like semi-finished product which is applied as a cladding to the substrate to be cladded, and fixed to said substrate.

For fixing purposes, it is advantageous for the cladding to be fixed to the substrate at regular intervals in a punctiform manner. Punctiform fixing of this type can, for example, be performed by means of adhesive points or else by rivet connections, it being possible for the rivet connections to simultaneously serve as electrical supply means for the flat electrodes which are required to activate the polymer actuator.

It is also advantageous for the cladding to be provided with through-holes. As a result, it is possible to ensure that the cladding can be reliably lifted away from the substrate during deformation since pressure compensation with respect to the cavities which form is possible through the through-holes.

A particular refinement of the invention is obtained when the cladding is composed of lamellae which are each individually fixed to the substrate by means of one end, with the lamellae each being polymer actuators in the form of bending actuators. In this refinement of the invention, the cladding is not formed by a closed film or foil, but has respective slots or intermediate spaces which separate the individual lamellae from one another, at least in subregions. In this way, each lamella can be understood as a bending actuator, with bending being produced by activating the respective polymer actuator. The lamellae are lifted away from the substrate at one end on account of the bending, since they are each fixed to the substrate by means of the other end. The surface produced by the cladding is therefore comparable with fish scales which together can form the boundary layer of the cladding and be deformed by standing the scales up. The deformation effect which can be achieved as a result is advantageously particularly great, so that the lamellae can be used particularly effectively, for example for removing a layer of ice or limescale from objects which are at risk from the build up of ice or limescale. At the same time, a surface which is advantageous in terms of flow dynamics can be produced by means of the lamellae, this surface being called sharkskin amongst experts.

A further solution to the abovementioned object provides for the cladding to bear against the cladded substrate by means of a bearing area which matches the surface area of the cladding in terms of magnitude, with the cladding being firmly connected to the substrate by means of the entire bearing area and having at least one electrode layer for the polymer actuator, which electrode layer extends only over a subregion of the polymer actuator. The connection of the cladding over the entire bearing area advantageously provides a particularly stable cladding for the substrate. This stability is also maintained when the polymer actuator is deformed. The polymer actuator is not deformed by the cladding being lifted and arching away from the substrate, but rather by applying an electric field to the polymer actuator only locally. An electric field is specifically generated in the polymer actuator only in those subregions which adjoin the electrode layer which covers only subregions of the polymer actuator. Since the other regions remain undeformed, even when an electric field is applied to the polymer actuator, these regions draw away from the adjoining deformed regions, so that the polymer actuator becomes thinner in the subregions in which the electrode layer is located, and the polymer actuator becomes thicker in the subregions outside the electrode layer. As a result, the boundary layer of the cladding is deformed, with a topography being produced which has raised and recessed areas in the boundary layer.

It is advantageous when the electrode layer forms the webs of a honeycomb-like structure on the polymer layer. As a result of this, a regular topography of the deformed boundary layer of the cladding can be advantageously produced, in which the projections are approximately circular and are separated from one another by a valley-like recess which is interconnected in a honeycomb-like manner. This design of the electrode layer also has the advantage that, although it covers only subregions of the polymer actuator, it forms an interconnected structure which firstly is simple to produce and can be applied to the polymer layer, and secondly can advantageously also be electrically contact-connected in a simple manner. It goes without saying that the electrode layer can also be patterned differently, for example in a linear manner, in order, for example, to texture the surface.

A further refinement of invention involves the substrate forming an electrode for a polymer layer of the polymer actuator. This is only possible when the substrate itself is electrically conductive. In this case, an electrode layer between the substrate and the polymer layer is not needed, and this advantageously reduces outlay on production. The substrate may, for example, be connected to ground, so that the potential for generating an electric field can be applied to the electrode layer at the boundary layer end.

Finally, one refinement of the two variants of the invention makes provision for the boundary layer to be in the form of an auxiliary layer on the polymer actuator. This auxiliary layer may perform various functions and thus advantageously improve or extend the functionality of the cladding. For example, an optical function (dye, luminous layer) is feasible. The auxiliary layer may also perform a protective function for the polymer actuator, so that said polymer actuator is protected against environmental influences. An auxiliary layer which creates a lotus effect of the surface on account of its surface structure is also feasible. However, it is important for functioning of the polymer actuator that the auxiliary layer is elastic, so that it does not prevent deformation of the boundary layer.

Further details of the invention are described below with reference to schematic exemplary embodiments. In the drawings

DETAILED DESCRIPTION OF THE INVENTION

Figure 1:
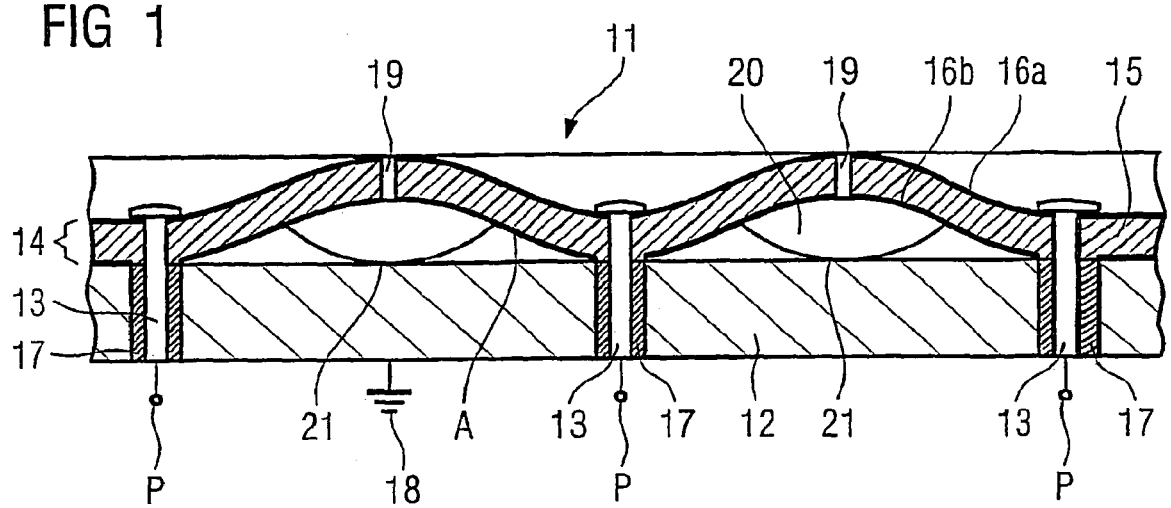
FIG. 1 shows a schematic section through an exemplary embodiment of the cladding according to the invention, in which a membrane-like polymer actuator which is fixed to the substrate in a punctiform manner is used.

According to FIG. 1, a cladding 11 is fixed to a substrate 12, which is to be cladded, by means of rivets 13 in a punctiform manner. The cladding is formed by a polymer actuator 14 which is designed as a membrane actuator. Said polymer actuator has a polymer layer 15 comprising an electrically active polymer which is provided with a respective electrode layer 16a, 16b on either side. The rivets 13 are fixed in electrically insulating sockets 17 in the substrate 12, so that electrical insulation of the rivets 13 from the substrate 12, which itself is electrically conductive, is ensured. The rivets 13 are electrically conductively connected to the electrode layer 16a which is averted from the substrate, whereas the electrode layer 16b which is adjacent to the substrate 12 is in contact with the latter. The substrate 12 can therefore be used as a grounding means 18 for the electrode layer 16b. If a potential P is applied via the rivets 13, the resulting electrical field in the polymer layer 15 leads to the deformation state, illustrated in FIG. 1, of the polymer actuator 14 which is characterized in that bulges in the cladding are produced between the rivets 13, which bulges arch away from the substrate 12.

The cladding according to FIG. 1 permits, for example, the aerodynamic properties of a boundary layer which is formed by the polymer actuator 14 to be changed. In the exemplary embodiment according to FIG. 1, the boundary layer is formed by the electrode layer 16a.

Since the polymer actuator 14 bears (not illustrated) firmly against the substrate 12 by means of a bearing area A without an intermediate space in the undeformed state, through-holes 19 are also provided in the cladding 11, so that pressure compensation can be performed as soon as a cavity 20 is formed between the cladding 11 and the substrate 12 on account of the deformation of the polymer actuator 14. Further contact points 21 between the cladding 11 and the substrate 12 are illustrated in the cavity 20 according to FIG. 1, these contact points being positioned behind the sectional plane according to FIG. 1 and being produced by hidden rivets which are adjacent to the illustrated rivets 13. The rivets 13 are arranged on the substrate in each case in the middle of the honeycombs of an imaginary honeycomb pattern.

In the other figures, corresponding components are each provided with the same reference symbols, these components only being explained again if they differ from the exemplary embodiment according to FIG. 1.

Figure 2:
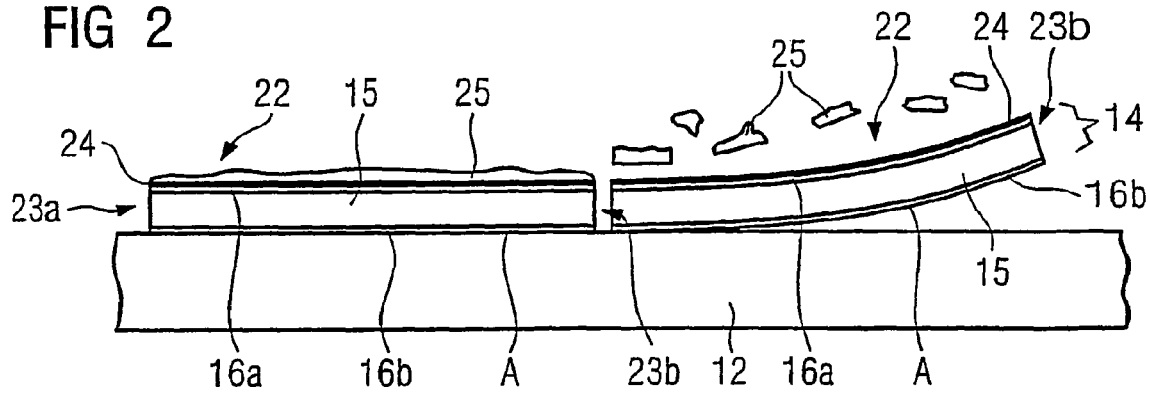
FIG. 2 shows a side view of an exemplary embodiment of the cladding according to the invention with lamella-like polymer actuators.

A cladding according to FIG. 2 comprises lamellae 22 which are each firmly connected to the substrate 12 by means of one end 23a, whereas the other end 23b bears only on the substrate 12 together with the bearing area A. The lamellae 22 have polymer actuators 14 which are designed as bending actuators. In order to cause the lamellae 22 to bend in the event of deformation of the polymer layer 15, the electrode layer 16b which faces the substrate 12 is provided with a much greater elasticity compared to the electrode layer 16a and an auxiliary layer 24 which is applied to said electrode layer. The lamellae are therefore bent by the electrode layer 16a and the auxiliary layer 24 of an extension of the polymer layer 15 being subject to a much greater resistance than the electrode layer 16b.

Depending on its properties, the auxiliary layer may fulfill additional functions of the cladding. In the exemplary embodiment according to FIG. 2, it increases the rigidity of the electrode layer 16a, for example, so that the functionality of the bending actuator is improved. The auxiliary layer may, for example, be composed of Teflon, so that adhesion of, for example, limescale deposits 25 is reduced and removal of the limescale deposits 25 is facilitated by operating the bending actuators.

Figure 3:
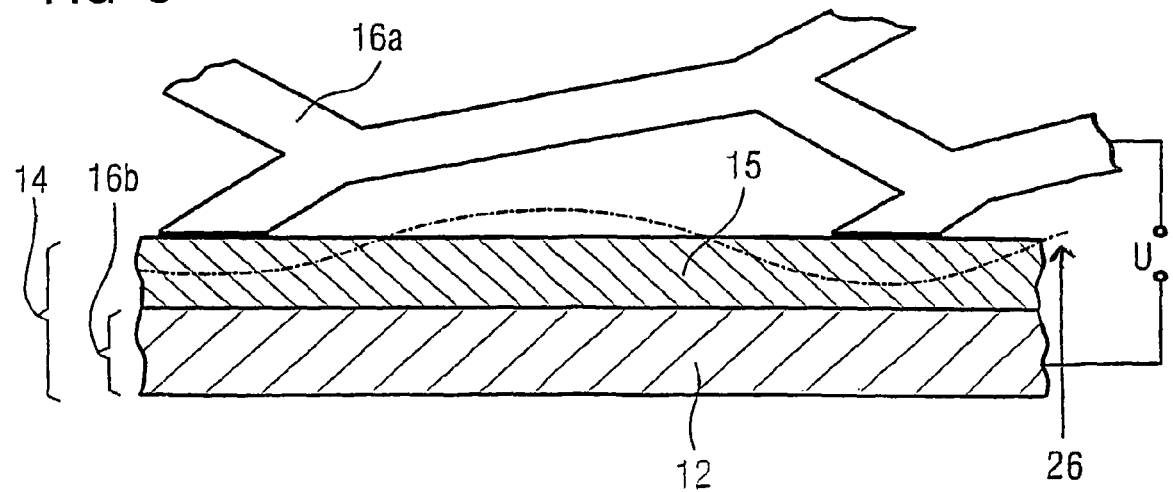
FIG. 3 shows a sectional perspective view of an exemplary embodiment of the cladding according to the invention with a polymer actuator which is mounted firmly over the entire surface area of the substrate, and a honeycomb-like electrode.

The cladding according to FIG. 3 is formed by the polymer layer 15 which is firmly connected to the substrate 12 over the entire surface area. The substrate 12 is designed to be electrically conductive and, in this respect, simultaneously forms an electrode layer 16*b* for activating the polymer layer 15. The other electrode layer 16*a* comprises webs which are connected to one another in the manner of a honeycomb on the free surface of the polymer layer 15. If a voltage U is applied to the electrode layers 16*a*, 16*b*, an electric field with locally differing values is produced in the polymer layer 15, with the field reaching a maximum in the region of the honeycomb-like webs of the electrode layer 16*a*. The deformation of the polymer layer 15, that is to say the reduction in their thickness, is therefore greatest in these regions, so that the material of the polymer layer is forced into the interior of the honeycombs which are formed by the webs, and there leads to the polymer layer 15 becoming thicker. This produces the profile 26 of the surface of the cladding which is indicated by the dash-dotted line. This change in shape of the surface can be used in the manner described above.

The polymer actuators 14 according to FIGS. 1 to 3 each have only one polymer layer 15. However, it is also possible to use layer actuators with a plurality of polymer layers (not illustrated), it being possible to increase the achievable extent of deformation as a result of this.

The invention claimed is:

1. A cladding comprising:
an elastic boundary layer which forms the surface of the cladding, and
a polymer actuator in the form of a membrane actuator which forms the cladding for the deformation of the boundary layer,
wherein the cladding bears on a substrate by means of a bearing area which matches the surface area of the cladding in terms of magnitude and bears fully on the substrate, with only subregions of the bearing area being fixed to the substrate, and wherein the cladding is provided with through-holes.

2. The cladding as claimed in claim 1, wherein the cladding is fixed to the substrate at regular intervals in a punctiform manner.

3. The cladding as claimed in claim 1, wherein said cladding is composed of individual lamellae which are each fixed to the substrate by means of one end, with the lamellae each being polymer actuators in the form of bending actuators.

4. The cladding as claimed in claim 1, wherein the boundary layer is in the form of an auxiliary layer on the polymer actuator.

5. A classing comprising: an elastic boundary layer which forms the surface of the cladding, and a polymer actuator in the form of a membrane actuator which forms the cladding for the deformation of the boundary layer, wherein the cladding bears against a substrate by means of a bearing area which matches the surface area of the cladding in terms of magnitude and bears fully on the substrate, with the cladding being firmly connected to the substrate by means of the entire bearing area so that the cladding is maintained in a stable manner such that the polymer actuator is not deformed by the cladding being lifted and arching away from the substrate, but by locally applying an electric field to the polymer actuator, wherein the cladding has at least one electrode layer for the polymer actuator, which electrode layer extends only over a subregion of the polymer actuator, and wherein the electrode layer forms the webs of a honeycomb-like structure on the polymer layer.

6. The cladding as claimed in claim 5, wherein the substrate forms an electrode for a polymer layer of the polymer actuator.

7. A classing comprising: an elastic boundary layer which forms the surface of the cladding, and a polymer actuator in the form of a membrane actuator which forms the cladding for the deformation of the boundary layer, wherein the cladding bears against a substrate by means of a bearing area which matches the surface area of the cladding in terms of magnitude and bears fully on the substrate, with the cladding being firmly connected to the substrate by means of the entire bearing area so that the cladding is maintained in a stable manner such that the polymer actuator is not deformed by the cladding being lifted and arching away from the substrate, but by locally applying an electric field to the polymer actuator, wherein the cladding has at least one electrode layer for the polymer actuator, which electrode layer extends only over a subregion of the polymer actuator, and wherein the substrate forms an electrode for a polymer layer of the polymer actuator.

* * * * *